(12) United States Patent
Zaliznyak et al.

(10) Patent No.: US 8,378,329 B2
(45) Date of Patent: Feb. 19, 2013

(54) NANODEVICES FOR SPINTRONICS AND METHODS OF USING SAME

(75) Inventors: Igor Zaliznyak, Port Jefferson, NY (US); Alexei Tsvelik, Stony Brook, NY (US); Dmitri Kharzeev, Port Jefferson, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 449 days.

(21) Appl. No.: 12/530,862

(22) PCT Filed: Feb. 29, 2008

(86) PCT No.: PCT/US2008/002761
§ 371 (c)(1),
(2), (4) Date: Dec. 18, 2009

(87) PCT Pub. No.: WO2008/130465
PCT Pub. Date: Oct. 30, 2008

(65) Prior Publication Data
US 2010/0109712 A1    May 6, 2010

Related U.S. Application Data

(60) Provisional application No. 60/892,595, filed on Mar. 2, 2007.

(51) Int. Cl.
*H01L 21/00* (2006.01)
*G11B 5/33* (2006.01)
(52) U.S. Cl. ......... 257/2; 257/3; 257/4; 257/5; 257/421; 257/427; 438/3; 438/102; 438/103; 365/157; 977/700
(58) Field of Classification Search .............. 257/2–5, 257/421–427, E29.002, E29.323; 438/3, 438/102–103; 365/157–158, 171–173; 360/324–326, 313
See application file for complete search history.

(56) References Cited

U.S. PATENT DOCUMENTS

| | | | | |
|---|---|---|---|---|
| 6,438,026 | B2 * | 8/2002 | Gillies et al. | 365/158 |
| 8,247,060 | B2 * | 8/2012 | Bratkovski et al. | 428/78 |
| 2005/0238565 | A1 * | 10/2005 | Sullivan | 423/447.1 |
| 2006/0057743 | A1 * | 3/2006 | Epstein et al. | 438/3 |
| 2006/0186433 | A1 * | 8/2006 | Kasai et al. | 257/108 |
| 2011/0042720 | A1 * | 2/2011 | Jalil et al. | 257/194 |

OTHER PUBLICATIONS

L. Aleiner, D.E. Kharzeev, and A.M. Tsvelik, "Spontaneous Symmetry Breaking in Graphene Subjected to an In-Plane Magnetic Field," *Phys. Rev. B*, 76, The American Physical Society, pp. 195415-1-195415-27 (2007).

M.N. Baibich, J. M. Broto, A. Fert, F. Nguyen Van Dau, and F. Petroff, P. Eitenne, G. Creuzet, A. Friederich, and J. Chazelas, "Giant Magnetoresistance of (001)Fe/(001)Cr Magnetic Superlattices," *Phys. R. Letters*, The American Physical Society, 61:21, pp. 2472-2475 (Nov. 1988).

(Continued)

*Primary Examiner* — Jami M Valentine
(74) *Attorney, Agent, or Firm* — Dorene M. Price

(57) ABSTRACT

Graphene magnet multilayers (GMMs) are employed to facilitate development of spintronic devices. The GMMs can include a sheet of monolayer (ML) or few-layer (FL) graphene in contact with a magnetic material, such as a ferromagnetic (FM) or an antiferromagnetic material. Electrode terminals can be disposed on the GMMs to be in electrical contact with the graphene. A magnetic field effect is induced in the graphene sheet based on an exchange magnetic field resulting from a magnetization of the magnetic material which is in contact with graphene. Electrical characteristics of the graphene can be manipulated based on the magnetization of the magnetic material in the GMM.

27 Claims, 10 Drawing Sheets

OTHER PUBLICATIONS

C. Berger, Z. Song, X. Li, X. Wu, N. Brown, C. Naud, D. Mayou, T. Li, J. Hass, A. N. Marchenkov, E.H. Conrad, P.N. First, W.A. de Heer, "Electronic Confinement and Coherence in Patterned Epitaxial Graphene," *Science*, 312, pp. 1191-1196 (May 2006).

G. Binasch, P. Grünberg, F. Saurenbach and W. Zinn, "Enhanced Magnetoresistance in Layered Magnetic Structures with Antiferromagnetic Interlayer Exchange," *Phys. Rev. B*, 39:7, The American Physical Society, pp. 4828-4830 (Mar. 1989).

J. A. Borchers, R. W. Erwin, S. D. Berry, D. M. Lind, J. F. Ankner, E. Lochner, K. A. Shaw and D. Hilton, "Long-Range Magnetic Order in $Fe_3O_4$/NiO Superlattices," *Phys. Rev. B*, 51:13, The American Physical Society, pp. 8276-8286, (1995).

J. A. Borchers, M.J. Carey, R.W. Erwin, C.F. Majkrzak, and A.E. Berkowitz, "Spatially Modulated Antiferromagnetic Order in CoO/NiO Superlattices," *Phys. Rev. Letters*, 70:12, The American Physical Society, pp. 1878-1881 (Mar. 1993).

A. Bostwick, T. Ohta, T. Seyller, K. Horn and E. Rotenberg, "Quasiparticle Dynamics in Graphene," *Nature Physics*, Advance Online Publication, www.nature.com/nature physics, Nature Publishing Group, pp. 1-5 (2006).

S.A. Chambers, T.C. Droubay, C.M. Wang, K.M. Rosso, S.M. Heald, D.A. Schwartz, K.R. Kittilstved, and D.R. Gamelin, "Ferromagnetism in Oxide Semiconductors," *Materials Today*, 9:11, pp. 28-35 (Nov. 2006).

A. Charrier, A. Coati, T. Argunova, F. Thibaudau, Y. Garreau, R. Pinchaux, I. Forbeaux, J.-M. Debever, M. Sauvage-Simkin and J.-M. Themlin, "Solid-State Decomposition of Silicon Carbide for Growing Ultra-Thin Heteroepitaxial Graphite Films," *J. Appl. Phys.*, 92:5, American Institutes of Physics, pp. 2479-2484 (2002).

J.M.D. Coey, M. Venkatesan, C.B. Fitzgerald, A.P. Douvalis, I.S. Sanders, "Ferromagnetism of a Graphite Nodule from the Canyon Diablo Meteorite," *Nature*, 420, Nature Publishing Group, pp. 156-159 (Nov. 2002).

J.M. Daughton, "GMR Applications," *J. of Magnetism & Mag. Materials*, 192, Elsevier Science B.V., pp. 334-342 (1999).

T. Dietl and H. Ohno, "Engineering Magnetism in Semiconductors," *Materials Today*, 9:11, Elsevier Ltd., pp. 18-26 (2006).

C.M. Fang, G.A. de Wijs and R.A. de Groot, "Spin-Polarization in Half-Metals (invited)," *J. App. Phys.*, 91:10, American Institute of Physics, pp. 8340-8344 (2002).

R. Fiederling, M. Keim, G. Reuscher, W. Ossau, G. Schmidt, A. Waag & L.W. Molenkamp, "Injection and Detection of a Spin-Polarized Current in a Light-Emitting Diode," *Nature*, 402, MacMillian Magazines Ltd., pp. 787-790 (1999).

M.R. Fitzsimmons, S.D. Bader, J.A. Borchers, G.P. Felcher, J.K. Furdyna, A. Hoffmann, J.B. Kortright, I.K. Schuller, T.C. Schulthess, S.K. Sinha, M.F. Toney, D. Weller, S. Wolf, "Neutron Scattering Studies of Nanomagnetism and Artificially Structured Materials," *J. of Magnetism & Mag. Materials*, 271, Elsevier B.V., pp. 103-146 (2004).

I. Forbeaux, J.-M. Themlin and J.-M. Debever, "Heteroepitaxial Graphite on 6H-SiC(0001): Interface Formation Through Conduction-Band Electronic Structure," *Phys. Rev. B*, 58:24, The American Physical Society, pp. 16396-16406 (1998).

E.V. Gorbar, V.P. Gusynin, V.A. Miransky, I.A. Shovkovy, "Magnetic Field Driven Metal-Insulator Phase Transition in Planar Systems," *Phys. Rev. B*, 66, The American Physical Society, pp. 045108-1-045108-22(2002).

P. Grünberg, R. Schreiber, and Y. Pang, M.B. Brodsky and H. Sowers, "Layered Magnetic Structures: Evidence for Antiferromagnetic Coupling of Fe Layers across Cr Interlayers," *Phys. Rev. Letters*, 57:19, The American Physical Society, pp. 2442-2445 (Nov. 1986).

J. Hass, R. Feng, T. Li, X. Li, Z. Zong, W.A. de Heer, P.N. First, and E.H. Conrad, C.A. Jeffrey and C. Berger, "Highly Ordered Graphene for Two Dimensional Electronics," *App. Phys. Letters*, 89, American Institute of Physics, pp. 143106-1-143106-3 (2006).

F.J. Himpsel, J.E. Ortega, G.J. Mankey, R.F. Willis, "Magnetic Nanostructures," *Adv. in Physics*, 47:4, Taylor & Francis Ltd., pp. 511-597 (1998).

Y. Ijiri, "Coupling and Interface Effects in Magnetic Oxide Superlattices," *J. Phys.: Condens. Matter*, 14, IOP Publishing Ltd., pp. R947-R966 (2002).

D.V. Khveschchenko, "Coulomb-Interacting Dirac Fermions in Disordered Graphene," *Phys. Rev. B*, 74, The American Physical Society, pp. 161402-1-161402-4 (2006).

D.V. Khveschchenko, "Ghost Excitonic Insulator Transition in Layered Graphite," *Phys. R. Letters*, 87:24, The American Physical Society, pp. 246802-1-246802-4 (Dec. 2001).

D.V. Khveschchenko, "Magnetic-Field-Induced Insulating Behavior in Highly Oriented Pyrolitic Graphite," *Phys. R. Letters*, 87:20, The American Physical Society, pp. 206401-1-206401-4 (Nov. 2001).

T. Matsuno, S. Sugahara and M. Tanaka, "Novel Reconfigurable Logic Gates Using Spin Metal-Oxide-Semiconductor Field-Effect Transistors," *Jap. J. of Appl. Phys.*, 43:9A, Japan Society of Applied Physics, pp. 6032-6037 (2004).

H.-Ch. Mertins, S. Valencia, W. Gudat, P.M. Oppeneer, O. Zaharko and H. Grimmer, "Direct Observation of Local Ferromagnetism on Carbon in C/Fe Multilayers," *Europhys. Letters* 66:5, EDP Sciences, pp. 743-748 (Jun. 2004).

J.S. Moodera, L.R. Kinder, T.M. Wong and R. Meservey, "Large Magnetoresistance at Room Temperature in Ferromagnetic Thin Film Tunnel Junctions," *Phys. R. Letters*, 74:16, The American Physical Society, pp. 3273-3276 (Apr. 1995).

A. Nagashima, N. Tejima, and C. Oshima, "Electronic States of the Pristine and Alkali-Metal-Intercalated Monolayer Graphite/Ni(111) Systems," *Phys. Rev. B*, 50:23, The American Physical Society, pp. 17487-17495 (Dec. 1994).

K.S. Novoselov, A.K. Geim, S.V. Morozov, D. Jiang, M.I. Katsnelson, I.V. Grigorieva, S.V. Dubonos, A.A. Firsov, "Two-Dimensional Gas of Massless Dirac Fermions in Graphene," *Nature*, 438, Nature Publishing Group, pp. 197-200 (Nov. 2005).

Y. Ohno, D.K. Young, B. Beschoten, F. Matsukura, H. Ohno and D.D. Awschalom, "Electrical Spin Injection in a Ferromagnetic Semiconductor Heterostructure," *Nature*, 402, MacMillan Magazines Ltd., pp. 790-792 (1999).

T Ohta, A. Bostwick, T. Seyller, K. Horn and E. Rotenberg, "Controlling the Electronic Structure of Bilayer Graphene," *Science*, 313, pp. 951-954 (2006).

C. Oshima and A. Nagashima, "Ultra-Thin Epitaxial Films of Graphite and Hexagonal Boron Nitride on Solid Surfaces," *J. Phys.: Condens. Matter*, 9, IOP Publishing Ltd., pp. 1-20 (1997).

J.-H. Park, E. Vescovo, H.-J. Kim, C. Kwon, R. Ramesh and T. Venkatesan, "Direct Evidence for a Half-Metallic Ferromagnet," *Nature*, 392, MacMillan Magazines Ltd., pp. 794-796 (Apr. 1998).

Th. Seyller, K.V. Emtsev, F. Speck, K.-Y. Gao and L. Ley, "Schottky Barrier Between 6H-SiC and Graphite: Implications for metal/SiC Contact Formation," *Appl. Phys. Letters*, 88, American Institute of Physics, pp. 242103-1-242103-3 (2006).

A.M. Shikin, G.V. Prudnikova, V.K. Adamchuk, F. Moresco and K.-H. Rieder, "Surface Intercalation of Gold Underneath a Graphite Monolayer on Ni(111) Studied by Angle-Resolved Photoemission and High-Resolution Electron-Energy-Loss Spectroscopy," *Phys. Rev. B*, 62:19, The American Physical Society, pp. 13202-13208 (Nov. 2000).

S. Sugahara and M. Tanaka, "A Spin Metal-Oxide-Semiconductor Field-Effect Transistor using Half-Metallic-Ferromagnet Contacts for the Source and Drain," *Appl. Phys. Letters*, 84:13, American Institute of Physics, pp. 2307-2309 (Mar. 2004).

K. Sugawara, T. Sato, S. Souma, T. Takahashi, and H. Suematsu, "Fermi Surface and Edge-Localized States in Graphite Studied by High-Resolution and Angle-Resolved Photoemission Spectroscopy," *Phys. Rev. B*, 73, The American Physical Society, pp. 045124-1-045124-4 (2006).

R.C. Tatar and S. Rabii, "Electronic Properties of Graphite: A Unified Theoretical Study," *Phys. Rev. B*, 25:6, The American Physical Society, pp. 4126-4141 (1982).

S.A. Wolf, D.D. Awschalom, R.A. Buhrman, J.M. Daughton, S. von Molnár, M.L. Roukes, A.Y. Chtchelkanova and D.M. Treger, "Spintronics: A Spin-Based Electronics Vision for the Future," *Science*, 294, pp. 1488-1495 (2001).

Y. Zhang, Y-W. Tan, H.L. Stormer, and P. Kim, "Experimental Observation of the Quantum Hall Effect and Berry's Phase in Graphene," *Nature*, 438, Nature Publishing Group, pp. 201-204 (Nov. 2005).

S.Y. Zhou, G.-H. Gweon, J. Graf, A.V. Fedorov, C.D. Spataru, R.D. Diehl, Y. Kopelevich, D.-H. Lee, S.G. Louie, A. Lanzara, "First Direct Observation of Dirac Fermions in Graphite," *Nature Phys.*, 2, Nature Publishing Group, pp. 595-599 (Sep. 2006).

J-G. Zhu, C. Park, "Magnetic Tunnel Junctions," *Materials Today*, 9:11, Elsevier Ltd., pp. 36-45 (Nov. 2006).

Biswas, C. et al., "Graphene Versus Carbon Nanotubes in Electronic Devices," *Advanced Functional Materials*, vol. 21, pp. 3806-3826, 2011.

Khodas, M. et al., "Spin-Polarized Transport Through a Domain Wall in Magnetized Graphene," *Physical Review B*, vol. 80, pp. 1-10, 2009.

\* cited by examiner

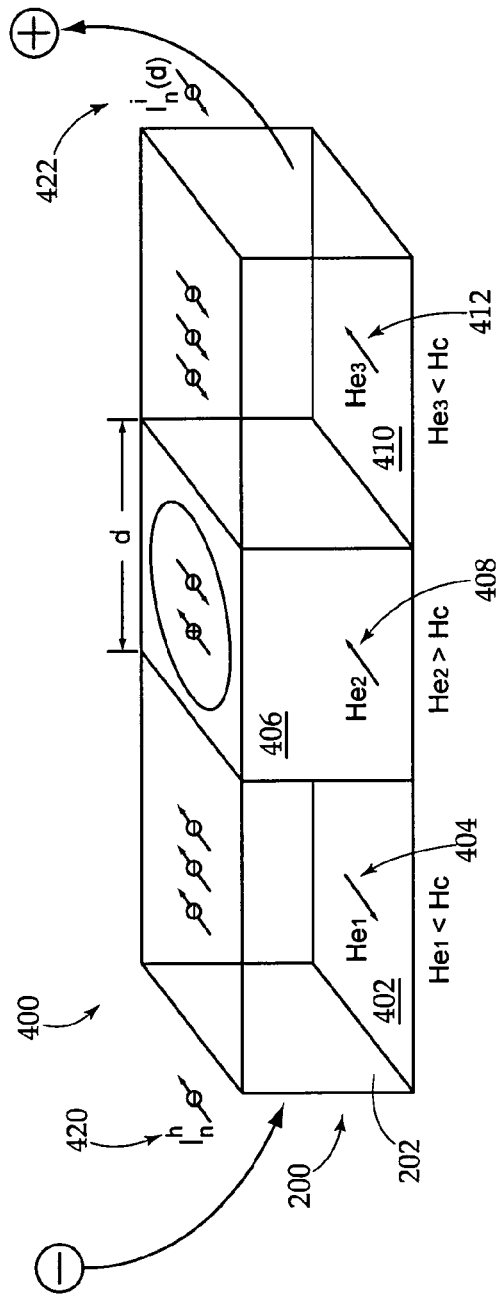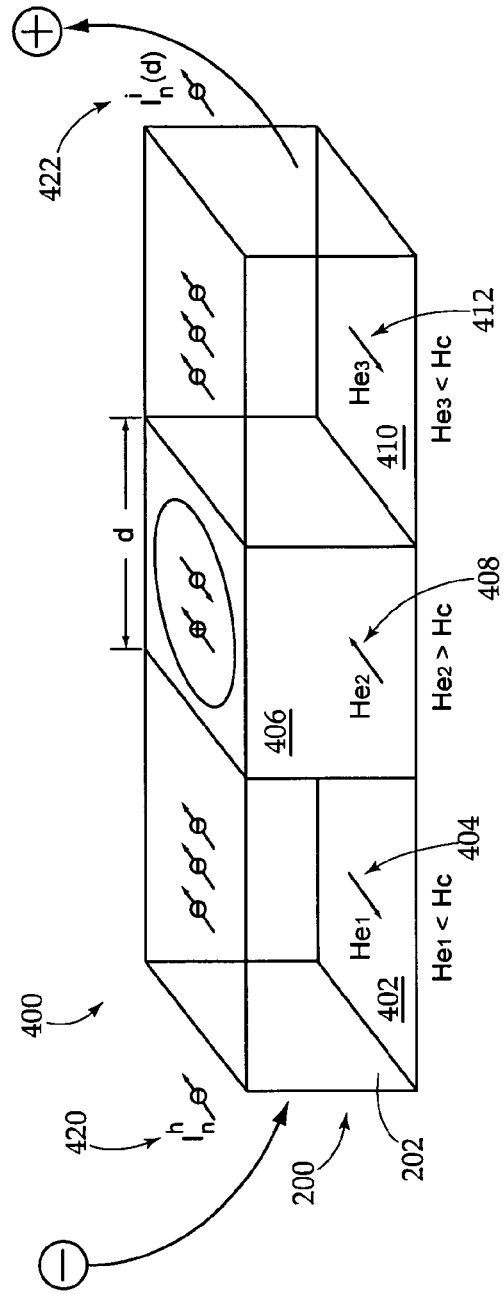
FIG. 4A
FIG. 4B

NANODEVICES FOR SPINTRONICS AND METHODS OF USING SAME

This application claims benefit of U.S. Provisional Application Ser. No. 60/892,595 filed Mar. 2, 2007, which is incorporated herein by reference in its entirety.

This invention was made with Government support under contract number DE-AC02-98CH10886, awarded by the U.S. Department of Energy. The Government has certain rights in the invention.

BACKGROUND OF THE INVENTION

The invention relates to the field of spintronics and, in particular, to graphene-(antiferro)-ferromagnet multilayers (GMMs) useful in spintronic devices.

Progress in the miniaturization of traditional solid state electronics based on manipulating electronic charges is rapidly approaching the natural technological limit imposed by the discrete atomic structure of matter. Already working at the nanometer scale, current technology not only encounters significant challenges requiring ever-increasing nanoscience research and design effort, but after a more than six order-of-magnitude reduction in size of the electronic components achieved by the beginning of this century, there is less than an order of magnitude left to go. Consequently, there has been a growing recognition that one of the avenues for future progress rests with a new approach in electronics, dubbed spintronics, where not only electron's charge, but also its quantum spin degree of freedom is manipulated.

The first application of a spintronic effect, giant magnetoresistance or GMR, can be found in magnetic sensing devices. GMR technology uses one type of electron spin manipulation, the change in resistance of a resistive element in the presence of a magnetic field. GMR elements can therefore be considered spintronic analogues of conventional resistors. These devices have been applied to magnetic read heads for computer hard drives and magnetic random access memory (MRAM). They also garnered the 2007 Nobel Prize in Physics for discoverers Albert Fert and Peter Grünberg.

A number of materials, including natural half-metals, such as chromium dioxide, doped perovskite manganites, and various magnetic semiconductors have been investigated as possible sources of spin-polarized electrons for spintronic devices.

At present, available devices sensitive to the polarization of electric current utilize the GMR-dependence of the resistance on the spin orientation in alternating ferromagnetic and antiferromagnetic or magnetic and nonmagnetic multilayers, e.g. in Iron/Chromium/Iron (Fe/Cr/Fe) trilayers. For a Cr interlayer of appropriate thickness, the coupling between the adjacent ferromagnetic iron layers is antiferromagnetic, and in the absence of an external magnetic field their magnetizations are antiparallel. An external magnetic field can co-align magnetization of magnetic layers and this decreases the amount of spin-dependent electron scattering, decreasing the resistance. At present, approximately 90% of all hard drive read heads use the GMR technology which allows the storage density to be increased by over two orders of magnitude compared to earlier technology.

Other approaches to producing spin-polarized electric currents are based on magnetically doped semiconductors, such as $(Ga_{1-x}Mn_x)As$, $(In_{1-x}Mn_x)As$, $(Be_{1-x}Mn_xZn_y)Se$, $Cd_{1-x}Mn_xTe$, etc., where the properties of ferromagnetic and semiconducting systems are combined on the material level. Both semiconducting properties and carrier-controlled magnetism of these materials are mediated by the same doped charge carriers. Hence, there exists not only direct coupling between the two, but also an intricate interplay between magnetic and semiconducting properties, requiring a fine doping/compositional optimization, which has hindered technological progress so far. Similar material chemistry problems are creating obstacles on the path of using natural semimetals with spin-polarized electronic bands, such as $Fe_3O_4$, or $La_{0.7}Sr_{0.3}MnO_3$.

SUMMARY

Thus, realizing the complications associated with dependence on only compositional techniques to utilize spin-polarized bands/currents, the inventors propose a multi-layer approach, making use of the particularly attractive properties of graphene.

The preferred embodiments of the present invention include a spintronic device, an apparatus that includes a spintronic device, and methods of using and making spintronic device(s) that utilize a graphene sheet having first and second surfaces and at least two electrode terminals.

The graphene sheet can have a thickness less than about 10 nanometers, or can have a thickness of a single monolayer of carbon, or can have a thickness of multiple monolayers of graphene. In some embodiments, the graphene sheet can possess a non-zero magnetization. An electrical property of the graphene sheet is based on a magnetic field effect induced in the graphene sheet.

The at least two electrode terminals are electrically coupled to the graphene sheet and are spaced apart. The graphene sheet is configured to conduct an electric signal between the at least two electrode terminals and is configured to affect an electrical signal based on the magnetic field effect induced in the graphene sheet. The electrical properties of the graphene sheet are related to the magnetic field effect induced in the graphene sheet.

The spintronic device can also include one or more magnetic materials, where at least one of the magnetic materials is in contact with at least a portion of the first or second surface of the graphene sheet. The magnetic material can have a non-zero magnetization which induces the magnetic field effect in the graphene sheet. In a preferred embodiment, at least one of magnetic materials is disposed on the graphene sheet as a continuous layer, or as a plurality of non-continuous discrete sections. It can be further covered with properly mated additional magnetic layer(s). The magnetic materials can include ferromagnetic and antiferromagnetic materials. The ferromagnetic material can be in contact with the graphene sheet, or the antiferromagnetic material can be in contact with the graphene sheet and the ferromagnetic material can be in contact with the antiferromagnetic material, and combinations of order may be considered. Contacting the graphene sheet with a metallic layer, whether or not part of the device structure, may lead to poorer device performance. Magnetic moments of the magnetic materials can be correlated and the alignment of the magnetic moments of the magnetic materials can also be correlated.

To use a preferred embodiment of a spintronic device having a graphene magnet multilayer (GMM), an electrical input signal, such as an electric current, is supplied to a first electrode terminal that is in electrical contact with a graphene sheet. The electrical input signal passes through the graphene sheet, in the plane of the sheet, and the graphene sheet affect the electrical input signal based on a magnetic field effect induced in the graphene sheet. An electrical output signal is obtained at one or more of the at least two electrode terminals in response to the electrical input signal. The electrical output signal is based on the electrical input signal and the magnetic field effect induced in the graphene. A magnitude of the magnetic field effect can be varied to vary an electrical property of the graphene sheet. The electric input signal can be polarized based on the magnetic field effect induced in the graphene sheet. A magnetization in a magnetic material of the GMM can be induced, which in turn induces the magnetic field effect in the graphene sheet. Different magnetic field effects can be induced in different regions of the graphene.

To form a spintronic device a graphene sheet is disposed on a substrate which may be a non-magnetic or a first magnetic material. Additionally, at least two electrodes are disposed on the graphene sheet to provide regions for electrically coupling to the graphene. A magnetization is induced in the first magnetic material. In some embodiments, the first magnetic material can be an antiferromagnetic material and a second magnetic material of a ferromagnetic material can be formed on the first magnetic material.

Preferred embodiments of the present invention can be used to create and control devices based on spin-polarization in the presence of a magnetic field effect induced in a graphene sheet, such as spin-controlled transistors and logic gates, and the like. Active, re-writable, and re-configurable devices can be formed in accordance with the preferred embodiments of the present so that the function of these devices can change depending on the magnetization pattern of an underlying magnetic material.

Preferred embodiments of the present invention exploit spin-dependent splitting of the electronic bands in graphene based on a magnetic field effect induced in the graphene due to a magnetic proximity effect. The electrical and magnetic properties of devices implemented according to the preferred embodiments of the present invention are advantageously controlled by the magnetization of one or more magnetic materials, so that the graphene-based devices can be tuned and optimized independently. This control can be exploited in a variety of spintronic applications, embodiments of which are described herein.

The preferred embodiments of the present invention, as well as other objects, features and advantages of the present invention will be apparent from the following detailed description, which is to be read in conjunction with the accompanying drawings wherein like reference numerals in the various figures are utilized to designate like components. The scope of the invention is intended to be limited only by the claims appended hereto.

BRIEF DESCRIPTION OF THE DRAWINGS

FIGS. 4A through 4C depict exemplary magnetic tunnel junctions based on inhomogeneously magnetized graphene sheets.

DETAILED DESCRIPTION

Figure 1A:
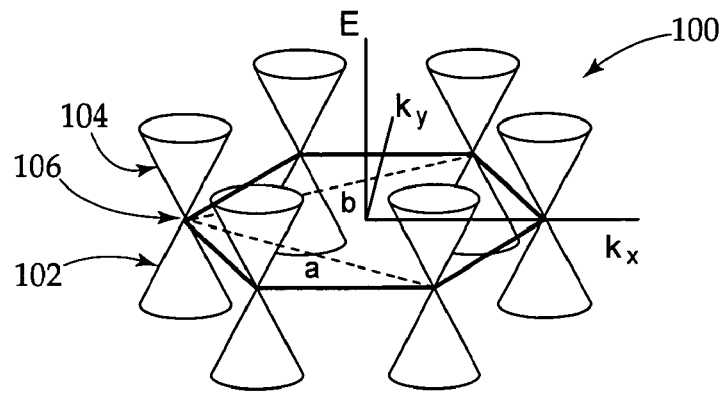
FIGS. 1A through 1C illustrate the low-energy electronic dispersion in graphene in applied magnetic fields of differing strengths.

A suite of electric/logic devices where spin-polarized electric currents are produced and controlled, including spin-polarized diodes, spin-controlled transistors and logic gates, and the like, which are referred to herein as "spintronic devices," can be realized using the techniques described herein. Such devices may be combined to form active, re-writable and re-configurable devices whose function changes depending on the magnetization pattern written on magnetic media, such as spin-MOSFET and NAND/NOR logic gates.

The preferred embodiments of the present invention can use graphene-magnet multilayers (GMMs), as described herein, to construct the suite of electric/logic elements by appropriately magnetizing the GMMs. The use of GMMs can be advantageously employed in (re-)writable microchips and processors that can be written from scratch in a magnetic drive, similar to bits of information in magnetic storage devices, and optimized for particular computational tasks as desired.

As used herein, "graphene" refers to a two-dimensional (2D) crystalline form of carbon. Graphite (a bulk form of carbon) and graphene form with hexagonal symmetry. Carbon nanotubes (CNT) may be thought of as graphene sheets rolled into tubes exhibiting one-dimensional (1D) properties. As a sheet, or ribbon, however, graphene has unique electrical and magnetic properties, as discussed in more detail with reference to FIGS. 1A through 1C.

As used herein, "graphene magnet multilayers" refers to a structure that includes at least one layer of graphene (e.g., a graphene sheet) and at least one magnetic material that is in contact with at least a portion of the graphene layer.

As used herein, the term "sheet" refers to a substantially planar structure having a monolayer or more layers of a material, which may be implemented as a continuous structure or as discrete sections of the material.

The term "monolayer" of a material need not be an atomically flat layer with full coverage of the underlying surface, but may be a layer of material with an average thickness of a single molecular layer having regions of thickness greater than one molecule and regions of virtually no coverage of the underlying surface.

As used herein, "few-layers" of graphene include multiple (at least two) monolayers but need not provide atomically smooth, complete coverage of an underlying surface. Few-layer graphene (FLG) may have about 2 to about 30 or more monolayers.

An important practical requirement for spintronic devices is that they operate at room temperature. To accomplish this, spin polarization is obtained and maintained at temperatures where thermal energy $k_B T$ ($k_B$ is the Boltzmann constant and T is temperature) equals or is less than the electron's magnetic Zeeman energy in a magnetic field that is typically greater than 220 Tesla, which is more than two orders of magnitude stronger than artificial fields available in magnetic recording devices.

One solution for implementing spintronic devices that operate at room temperature is to use magnetic half-metals or semiconductors, where the interplay of the Coulomb interaction and the Pauli exclusion principle, also known as the electron spin exchange interaction, results in a spin-dependent electronic band splitting such that the conduction band is polarized with respect to magnetization. Exchange is responsible for the ferromagnetism of common metals, such as iron and nickel, and the antiferromagnetism in their oxides. These magnetic properties can be maintained at temperatures up to several hundred degrees Celsius. Hence, magnetic band splitting caused by exchange can also be very large, and comparable to thermal energies at and above room temperature. While exchange can be viewed as an effective Weiss molecular (exchange) magnetic field acting on electrons in magnetic medium, this effective magnetic field originates from the electrostatic Coulomb interaction. For this reason, the exchange field can be much stronger than artificial magnetic fields from electromagnets, which are electrodynamic, caused by non-relativistic motion of electric charges, and therefore contain a "relativistic" small factor, $\sim\alpha\approx1/137$, compared with $\alpha\approx1$ in GMM structures. Another feature of the Weiss exchange field is that it only couples to spin.

Figure 1B:
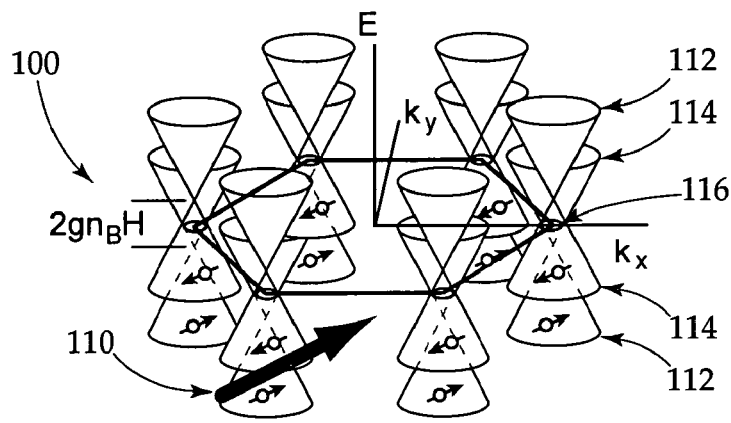
Figure 1C:
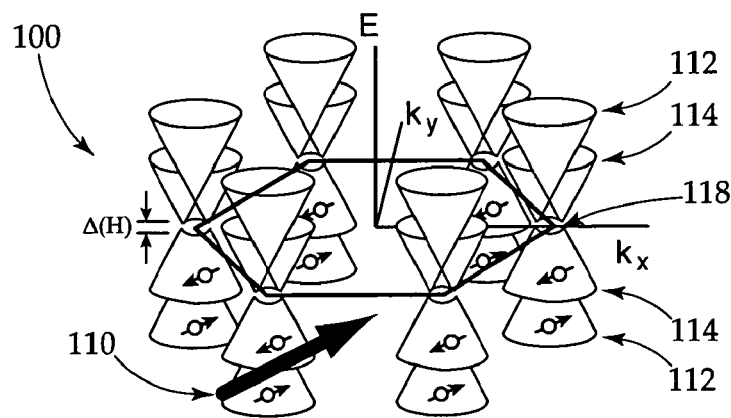

FIGS. 1A through 1C illustrate the low-energy electronic dispersion in graphene 100 for applied magnetic fields (H) of differing strengths. Referring to FIG. 1A, the low-energy electronic structure in graphene 100 results from the $sp^2$ C—C bonding in the hexagonal carbon layer and consists of two delocalized valence bands, a filled (electron) "bonding" $\pi$-band 102 and an empty (hole) "antibonding" $\pi^*$-band 104, which meet at a single point at the corners of the Brillouin zone (BZ) 106. In an ideal half-filled case corresponding to undoped graphene in zero magnetic field (FIG. 1A), this point lies exactly at the Fermi energy, resulting in a Fermi surface consisting of a set of points at BZ 106 corners. This results in a linear 2D dispersion, $\epsilon(k)=v_f k$, where $v_f$ is the fermion velocity, characteristic of massless fermions whose motion is governed by the 2D relativistic Dirac equation. Dotted lines show unit vectors a and b of the hexagonal lattice of a honeycomb graphene layer, containing two C atoms. Hence, there are two inequivalent Dirac points per hexagonal unit cell, forming the Fermi surface in neutral (undoped) graphene in the absence of magnetic field effect.

In FIG. 1B, the magnetic field (H) 110 parallel to the graphene 100 layer introduces Zeeman splitting of $2 g\mu_B H$ between the parallel spin (P) band 112 and the antiparallel spin (AP) band 114, where g stands for the Landee factor and $\mu_B$ for the Bohr magneton. Hence, P and AP bands 112 and 114 acquire coincident, electron-type and hole-type Fermi-surfaces, respectively, whose radius 116 is $k_f=g\mu_B H/v_f$. For strong enough magnetic fields (H) 110, electron-electron interactions lead to an excitonic instability, opening a gap $\Delta(H)$ 118 in the electronic dispersion, as depicted in FIG. 1C.

When graphene is mated to a magnetic (FM or AFM) material the graphene can be magnetized by the Weiss exchange field by virtue of the magnetic proximity effect to induce a magnetic field effect in the graphene. In this case, the completely polarized electron and hole bands of FIGS. 1B and 1C may result. This phenomenon may be exploited in a variety of spintronic applications, some embodiments of which are shown in FIGS. 3-5 and described below.

Several technologies for producing well-ordered monolayer (MG) and few layer (FLG) graphene, e.g., a graphene sheet, on different substrates can be implemented. In a first approach, depicted in FIG. 2A, high-quality MG and/or FLG 202 are grown either by chemical vapor deposition (CVD) or epitaxially in ultrahigh vacuum (UHV) on a hot reactive magnetic material substrate 208, such as metal or metal carbide (e.g., Ni(111), TiC(111) surface), at temperatures approximately 500°-600° C. and with carbon atoms supplied by the dissociation of a hydrocarbon gas such as ethylene or propylene. Thus, producing GMM 200'. Dramatic reduction of the hydrocarbon dissociation rate, up to 10-100 times, upon the MG layer allows precise control of the number of graphene layers deposited in this process. Using this method, MG or FLG layers can be formed on an amorphous ferromagnetic alloy such as CoPtCrB, or on the resulting graphene sheet, in addition to metal and carbide substrates. After the graphene is deposited, the graphene sheet can be capped by another material if desired. The order of deposition depends on the materials employed and the ultimate use of the GMM device.

Figure 2A:
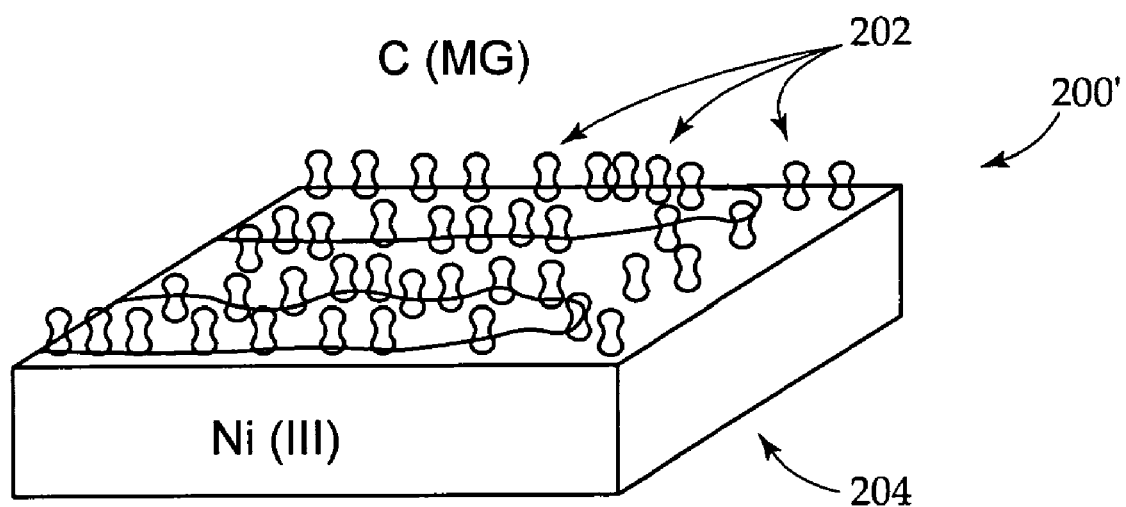
FIGS. 2A through 2D depict graphene-(antiferro)-ferromagnet multilayers (GMMs) in accordance with the preferred embodiments of the present invention.
Figure 2B:
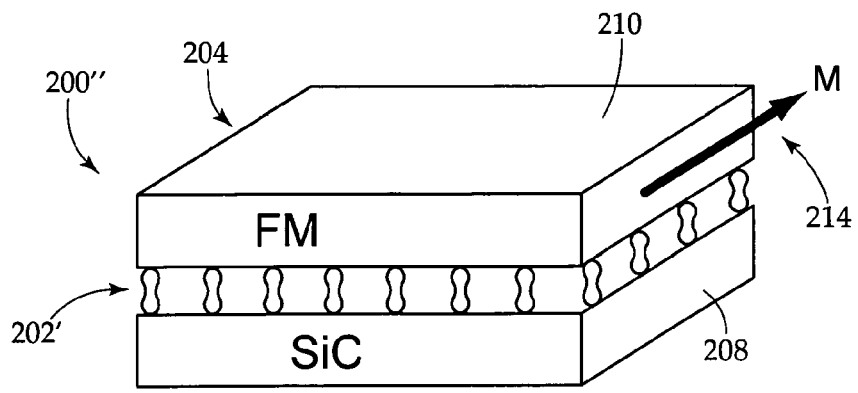

In a second approach, shown schematically in FIG. 2B, controlled layer-bylayer growth of epitaxial graphene 202 can be achieved by sublimation of Si from the substrate 208 surface, such as a silicon carbide (SiC) substrate, during thermal annealing in ultrahigh vacuum (UHV) at 1200° to 1500° C. By controlling the exposure time (typically 1 to 20 minutes) and the temperature of the solid state evaporation, unconstrained high-quality heteroepitaxial monolayer; bi-layer and few-layer graphene 202', as well as millimeter-sized single-crystalline graphite, can be grown. In this method the substrate 208 can be SiC, a wide-gap (~3 eV) semiconductor which is well suited for applications in semiconductor devices and commercially available in the form of high-quality oriented single-crystalline wafers. MG and FLG sheets obtained in this way have been shown to possess long-range structural coherence with domain sizes of 90 nm or more, high electron mobility with an elastic mean free path of about 600 nm, phase coherence lengths exceeding 1 $\mu$m at 4 K, and the ability to sustain high current densities of about 1 nA per carbon atom, similar to carbon nanotubes.

A popular technique for obtaining flakes of graphene is to "peel off" layers from a graphite source. In this case, the graphene may be temporarily affixed to a substrate while (anti-)ferromagnetic layers are formed.

Figure 2C:
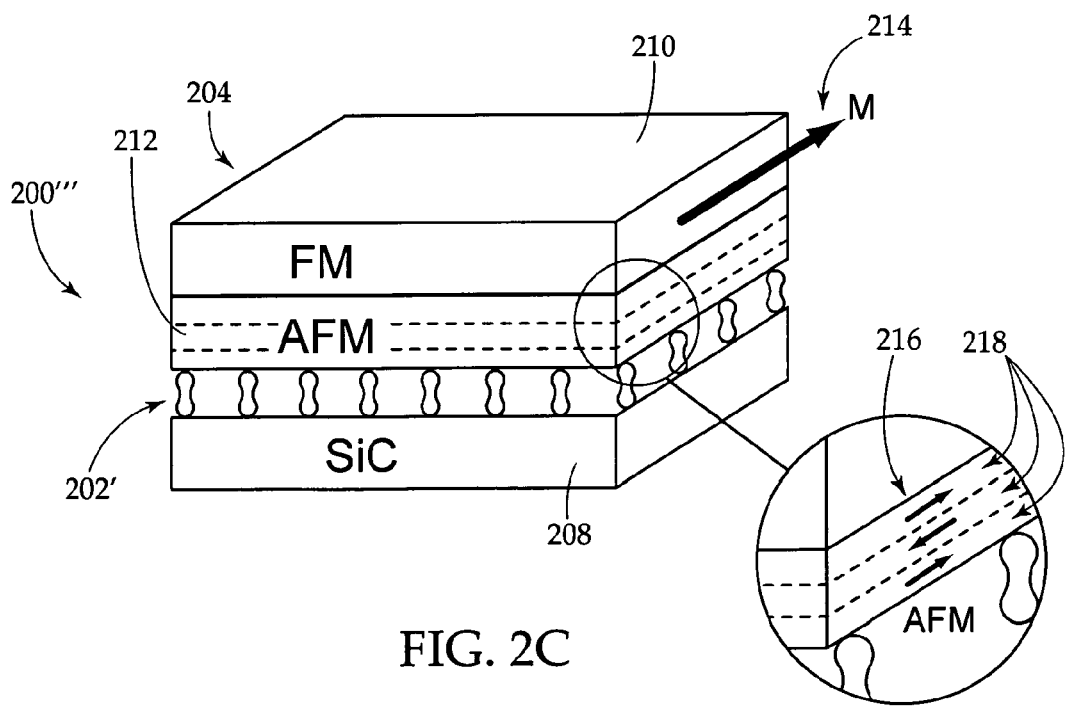

Referring to FIGS. 2B and 2C, resulting layers of graphene 202 (e.g. a graphene sheet) formed on SiC can be capped by depositing magnetic material(s) 204 of choice at a lower temperature, down to room temperature, thus forming graphene-(antiferro)-ferro magnet multilayers 200" and 200'", as seen in FIGS. 2B and 2C, respectively. In FIG. 2B, a graphene sheet 202' (MG or FLG) is topped with a layer of ferromagnetic (FM) material 210 such as Ni, CoPtCrB, or other FM material. FIG. 2C depicts an embodiment in which the graphene sheet 202' is topped by an AFM material 212, such as NiO or CoO, which in turn is topped by a FM material 210.

In ferromagnetic (FM) materials, electron spins are aligned parallel to an applied magnetic field leaving a spontaneous magnetization even after an external magnetic field, the inducing field, is removed. In antiferromagnetic (AFM) materials, adjacent spins are aligned: one parallel and one anti-parallel, so they show little or no spontaneous magnetism. Ferrimagnetic materials have two different kinds of magnetic ions; adjacent ions alternate spins parallel and anti-parallel to an applied field, but not equally, resulting in a net magnetization.

Still referring to FIGS. 2A through 2C, in preferred embodiments, the magnetic materials 204 (e.g. the ferromagnetic and antiferromagnetic materials) can have magnetizations (M) 214, which can be of different magnitudes and polarizations and which can induce the magnetic field effect in the graphene 202. The AFM can have layers 216 of magnetizations 218. Thus, a graphene magnet multilayer (GMM) 200 can be formed, as shown in FIGS. 2A through 2C. (As is customary in the art, figures are not to scale and are drawn to illustrate the relationships between elements.)

Figure 2D:
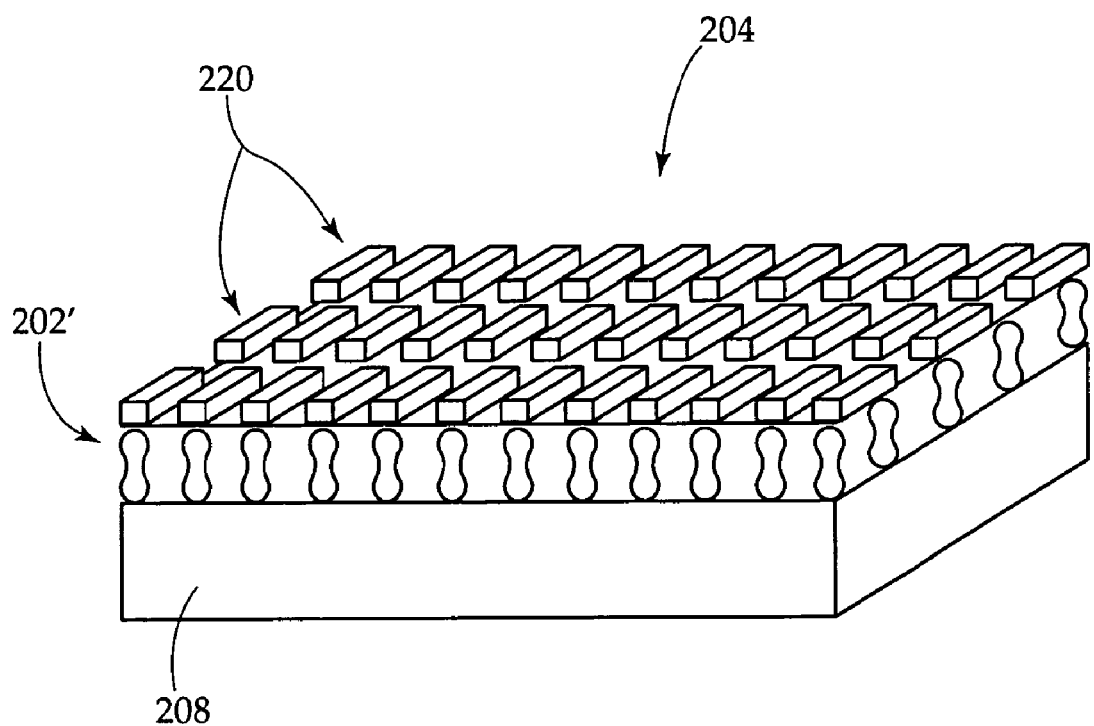

Referring to FIG. 2D, in a preferred embodiment, the magnetic materials 204 in contact with the graphene 202 in the GMMs 200 are discontinuous discrete sections 220 of magnetic materials 204. The sections 220 can be arranged as a patterned array, where each section has substantially identical magnetizations to achieve a desired electrical characteristic, such as, for example, Zeeman splitting. Alternatively, one or more sections 220 can have different magnetizations so as to achieve a desired electrical characteristic in a spintronic device, such as, for example, different spin-polarizations to facilitate spin-flipping of a spin-polarized electric current.

Strong hybridization of carbon $sp^2$ orbitals with d orbitals of magnetic 3D metals, either direct or through an intervening oxygen p orbital in magnetic oxides, exposes graphene electrons to an effective Weiss exchange field of enormous strength (a few hundred Kelvins or more) and can produce magnetic band splitting similar to that shown in FIGS. 1B and 1C.

The use of GMMs 200 allows creation of the full spectrum of devices which can be re-configured by appropriately changing the magnetization (M) 214 of the magnetic material(s) 204. Re-writable microchips and processors created on a single GMM 200 can be implemented based on the GMMs 200 described herein. In some embodiments, this change in magnetization can be facilitated by using temperature or light, as in the case of light-assisted (re-) magnetization.

Exchange fields experienced by electrons in a magnetic medium result from orbital overlaps and hybridization, such that electrons belonging to different atoms share common orbital states. Magnetic proximity effects arise from orbital hybridization at the interface between magnetic and non-magnetic materials, or between two magnetic materials. As a result, at the interface with magnetic material atomic electrons can experience the effective exchange field, which varies in strength among material pairs. Such exchange proximity effects are well documented in magnetic thin films and multilayers. For example, exchange coupling at the interface of the antiferromagnetic NiO or CoO whose bulk ordering temperatures (Neel temperature, $T_N$) are $T_N^{NiO} \approx 520$ K and $T_N^{CoO} \approx 291$ K, respectively, and the ferrimagnetic magnetite $Fe_3O_4$ (with a Curie temperature ($T_C$) of 858 K), induces antiferromagnetism in few-layer NiO and CoO films on $Fe_3O_4$ at a temperature one hundred or more degrees above $T_N$ (up to $2 T_N$ for CoO). Similarly, CoO antiferromagnetic ordering in NiO(2.1 nm)/CoO(1.5 nm) multilayers is shifted towards $T_N^{NiO}$, occurring about 100 K above $T_N^{CoO}$. All these proximity effects can be successfully understood on the mean field level as caused by an effective exchange field acting at the interface.

At the interface of graphite or graphene and a ferromagnetic or ferrimagnetic material, such as iron or magnetite, there may be a significant magnetic proximity effect. Angle-resolved photoemission spectroscopy (ARPES) of MG on a Ni(111) substrate indicates significant hybridization between graphene and the nickel conduction band. Obtaining magnetic band splitting in graphene by the magnetic proximity effect while avoiding distortion of graphene π bands through hybridization with the conduction band(s) of the substrate, may be accomplished by using insulating antiferromagnetic oxides, such as NiO and CoO, as described above. In these materials antiferromagnetic order exists in the form of ferromagnetic sheets with alternating magnetizations. Therefore, graphene on the uncompensated (111) surface may experience a homogeneous Weiss field by virtue of C—O—M (Carbon-Oxygen-Metal, where M=Ni, Co, Fe, for example) hybridization. It should be noted that the triangular symmetry of (111) planes in the cubic metal oxide rocksalt structure matches well with the hexagonal symmetry of graphene layer(s). By using solid solutions of AFM oxides such as $(Ni_{1-x}Co_x)_{1-y}(Al,Mg)_yO$ it may be possible to tune Zeeman band splitting in graphene induced by the effective Weiss (exchange) field by virtue of the proximity effect from 0 to about 0.05 eV. The orientation of this Weiss field from AFM metal oxides can be manipulated by changing the magnetization of the under/overlying ferro/ferrimagnetic layer such as Ni, Fe, or $Fe_3O_4$, again employing the magnetic proximity effect.

The crossing of the energy bands associated with two different sub-lattices in graphene results in the energy spectrum of electron and hole quasi-particles which is linear in momentum k (see FIG. 1A): $\epsilon(k)=v_F k$, where $v_F \approx 10^6$ m/s is the Fermi velocity. Such quasi-particles are formally described by the Dirac equation for massless fermions. One consequence is the conservation of "chirality" of quasiparticles, defined as a projection of the pseudospin on the momentum, k·σ.

A charge density wave establishes different population densities on the two sub-lattices of graphene. A charge density wave may not form in an isolated graphene sheet, but its formation may be facilitated by an external magnetic field perpendicular to the graphene plane. The formation of a spin density wave may also be facilitated by an in-plane magnetic field.

As described with respect to FIG. 1B, an in-plane magnetic field effect based on the exchange magnetic field has two effects. First, it induces Zeeman splitting of the electron and hole bands such that these bands overlap and second, it leads to extended Fermi surfaces for electrons and holes with a finite density of states at zero energy. In such a situation, the Coulomb attraction between electrons and holes can lead to formation of a chiral excitonic condensate (CEC), the condensate formed by bound states of electrons and holes with opposite chiralities. In the presence of a CEC, the chiralities of electrons and holes in graphene are no longer conserved. The formation of a CEC leads to the emergence of a gap in the quasiparticle dispersion such that graphene becomes an excitonic insulator, FIG. 1C. By magnetizing the magnet layer, the conductivity of graphene in a graphene-magnet multilayer (GMM) may be manipulated.

The critical temperature for the disappearance of the excitonic gap 118 (FIG. 1C) in the energy spectrum in graphene has been estimated as $T_c \sim 0.1$ B. This temperature may be significantly higher in double-layer graphene because of the larger overlap between the electron and hole bands caused by the quadratic gapless form of the quasi-particle spectrum in this material. When the strength of the effective Weiss magnetic field induced by the magnetic proximity effect in GMM is high, up to $10^3$ K, then the excitonic insulator phase in GMM may be formed at room temperature.

The technology described herein exploits the spin-dependent splitting of the valence bands in graphene in a magnetic field induced in GMMs due to the magnetic proximity effect. In these artificially layered structures, conducting and magnetic properties are controlled by different materials and in different layers, so that they can be tuned and optimized independently. Samples of graphene display almost ballistic conduction under some conditions, exhibiting extremely low resistance due, presumably, to little or no scattering. Because of the ballistic conduction in graphene, the magnetic proximity effect may result in coherent spin-polarized transport in GMM. Specific embodiments of representative GMM spintronic nanodevices are described with reference to FIGS. 3 through 5.

Figure 3A:
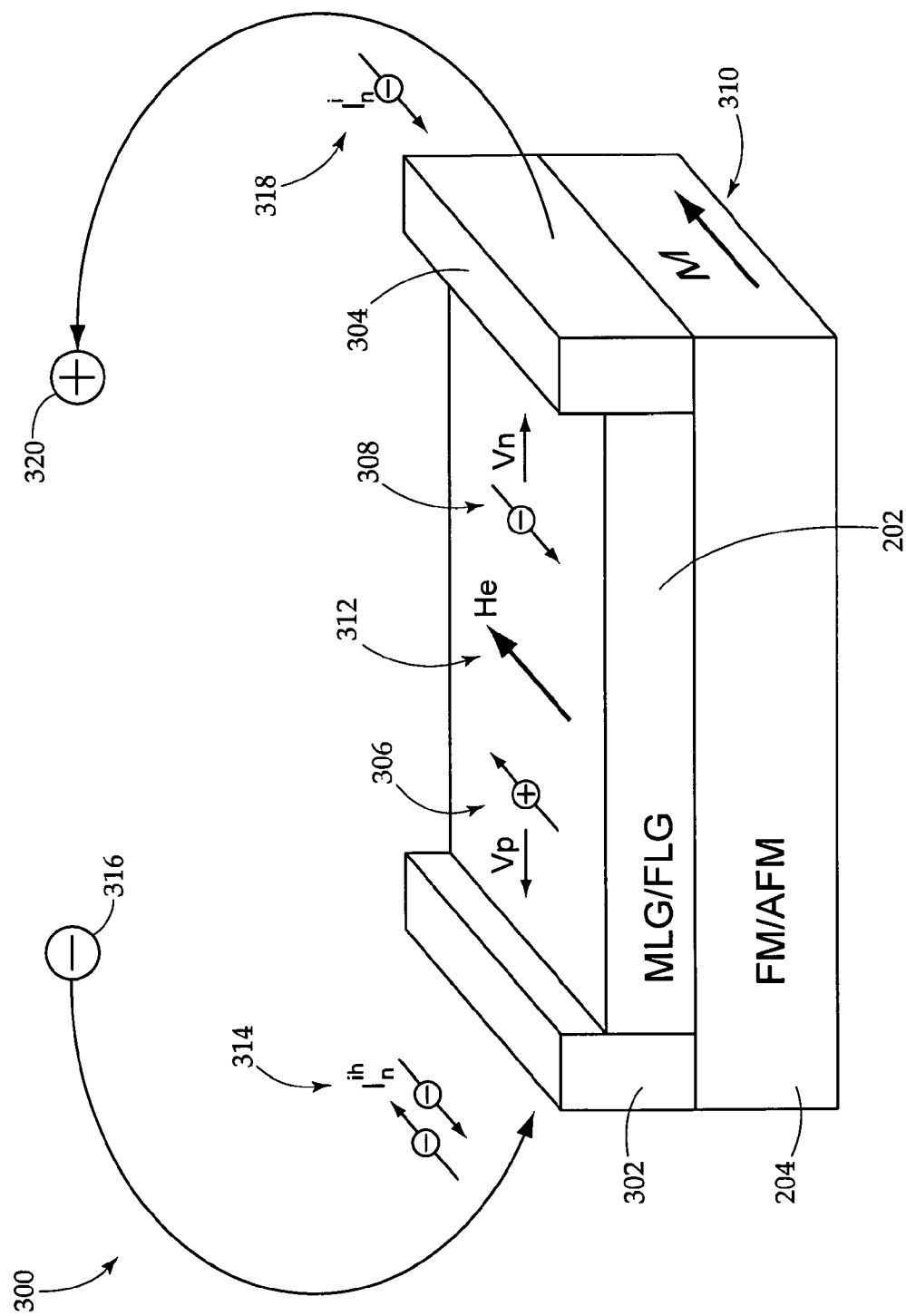
FIGS. 3A through 3C depict exemplary spintronic devices based on electric transport by polarized charge carriers in magnetized graphene.
Figure 3B:
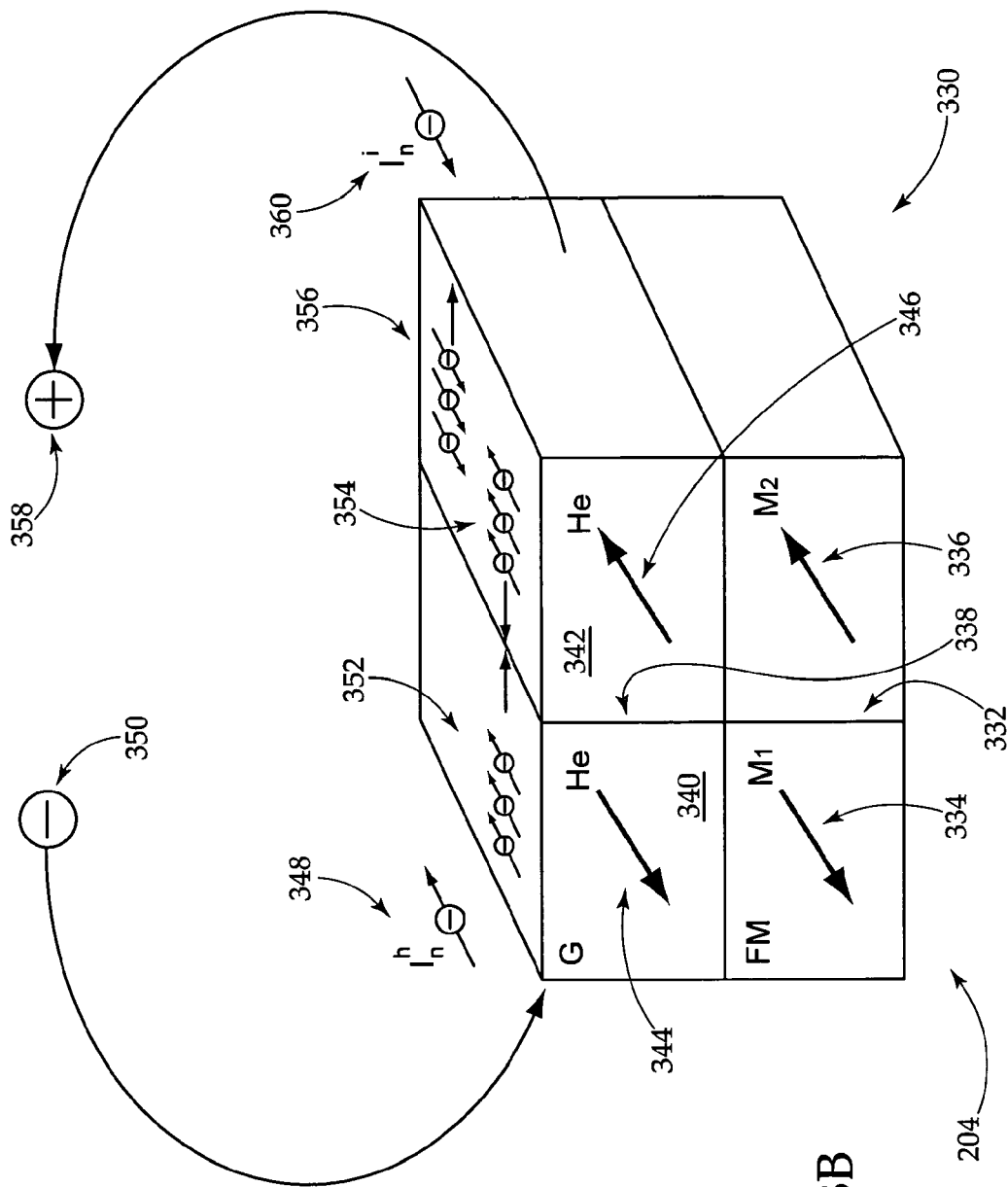
Figure 3C:
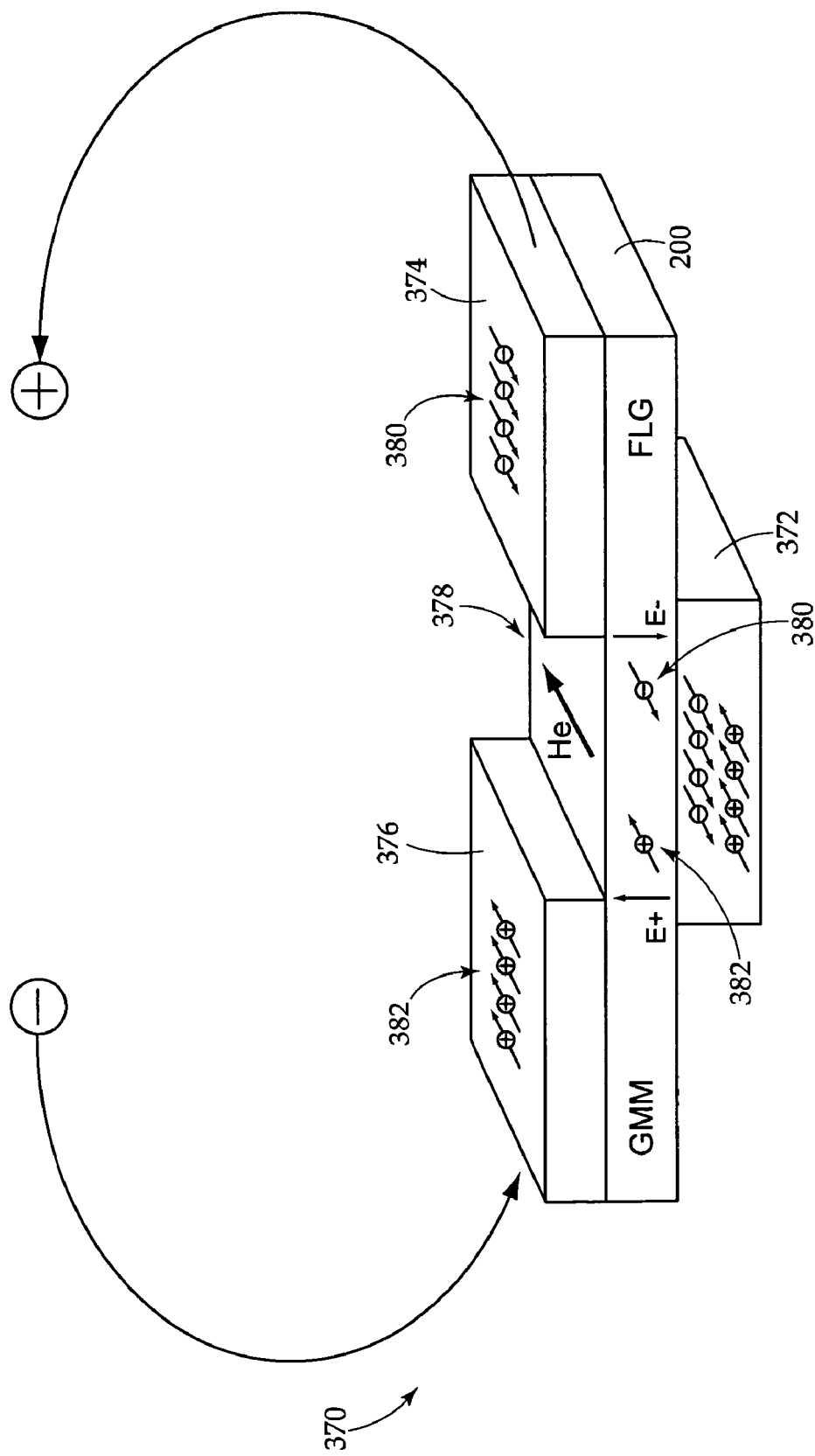

FIG. 3A through 3C depict exemplary spintronic devices based on electric transport by polarized charge carriers in magnetized graphene. (It should be noted that these figures are drawn with right angles and terminals at edges of regions of interest for ease of illustration. Real world devices can be of any convenient shape and contacts need not be regular or symmetric, but need only make electrical contact with areas of the graphene sheet spaced some distance from each other.) Charge carriers can include negatively charged electrons and positively charged holes.

FIG. 3A shows a diagram of a spintronic polarizer 300. In an electric field obtained by applying a voltage to the electrodes 302 and/or 304, holes 306 and electrons 308 drift in opposite directions. In this embodiment, the magnetic material(s) 204 have a magnetization (M) 310 and the graphene sheet 202 experiences a magnetic field effect ($H_e$) 312 induced by the magnetization (M) 310 of the magnetic material(s) 204. The magnetized graphene layer 202 acts as a polarizer of electric current. If an unpolarized electric input current 314 is supplied by the "negative" terminal (source) 316, AP electrons 308 with antiparallel spin move to the right and will be transmitted via electrode 304 producing a polarized electric output current 318 at the positive terminal 320. Electrons with parallel spin polarization will recombine with holes 306 moving to the left.

When working with beams of spin-polarized particles a device which flips the particle spin is an essential element in the polarized beam setup. Such a spin flipper device 330 is depicted in FIG. 3B. Electrode terminals have been left off for clarity, but those skilled in the art will recognize that electrode terminals can be placed at each end of the graphene 202. The spin flipper device 330 can include graphene 202 and magnetic material(s) 204 having a domain wall 332 in which the magnetic material to the left of the wall has a first magnetization ($M_1$) 334 and the magnetic material to the right of the domain wall 332 has a second magnetization ($M_2$) 336. In the present example, the magnetizations 334 and 336 are in opposite directions. The domain wall 332 in the magnetic material(s) 204 induces a wall 338 between two graphene 202 domains 340 and 342, which are magnetized according to a magnetic field effect induced by the magnetic material 204 so that the domains 340 and 342 are magnetized in opposite directions having magnetic field effects ($H_e$) 344 and 346, therefore acting as a spin inverter (flipper) for the appropriately polarized electron current.

A polarized electrical input current 348 can be supplied to the spin flipper device 330 via the negative terminal 350. Spin-polarized antiparallel electrons 352 (with respect to the induced magnetic field 344) related to the polarized current 348 can flow towards the domain wall 338 where the spin polarized antiparallel electrons 352 recombine with spin polarized parallel holes 354 (with respect to the induced magnetic field 346). Antiparallel (AP) spin electrons 356 can flow towards the right to the positive terminal 358 producing an output polarized current 360 that is polarized opposite that of the input polarized current 348 (i.e. flipped polarization).

FIG. 3C depicts a spin-polarized transistor 370 having a GMM 200 with an electrode terminal 372, an electrode terminal 374, and an electrode terminal 376. In a preferred embodiment, the GMM 200 includes a few-layer graphene (FLG) sheet having an induced magnetic field ($H_e$) 378. The magnetic material(s) in the GMM 200 have been omitted for clarity. Polarized electrons 380 and holes 382 moving in opposite directions in magnetic field (H) experience the same Lorentz force, i.e. polarized electrons and holes see opposite electric fields $E_-$ and $E_+$. Hence, there is no transverse Hall effect. Net charge on the top surface will be zero, but AP spin electrons 380 and P spin holes 382 will be collected on electrodes terminals, 374 and 376, respectively. Applying a gate voltage to the gate electrode terminal 372, results in the spin-polarized transistor 370. In the magnetized GMM spintronic transistor 370 shown here, the gate voltage is applied to the magnetized mono-/few-layer graphene film between the source and the drain leads. Such an electric field (supplied by the gate electrode shown on the bottom) destroys the symmetry between electron and hole Fermi surfaces, making one larger and the other smaller. Depending on the polarity of the applied voltage, this facilitates either electron or hole spin-polarized current and hinders the other. Thus, in this embodiment, the use of a magnetized graphene layer (i.e. graphene that experiences a magnetic field effect induced by an exchange magnetic field) produces a dependence of the current on the gate voltage similar to an FET, but for a spin-polarized current.

Figure 4C:
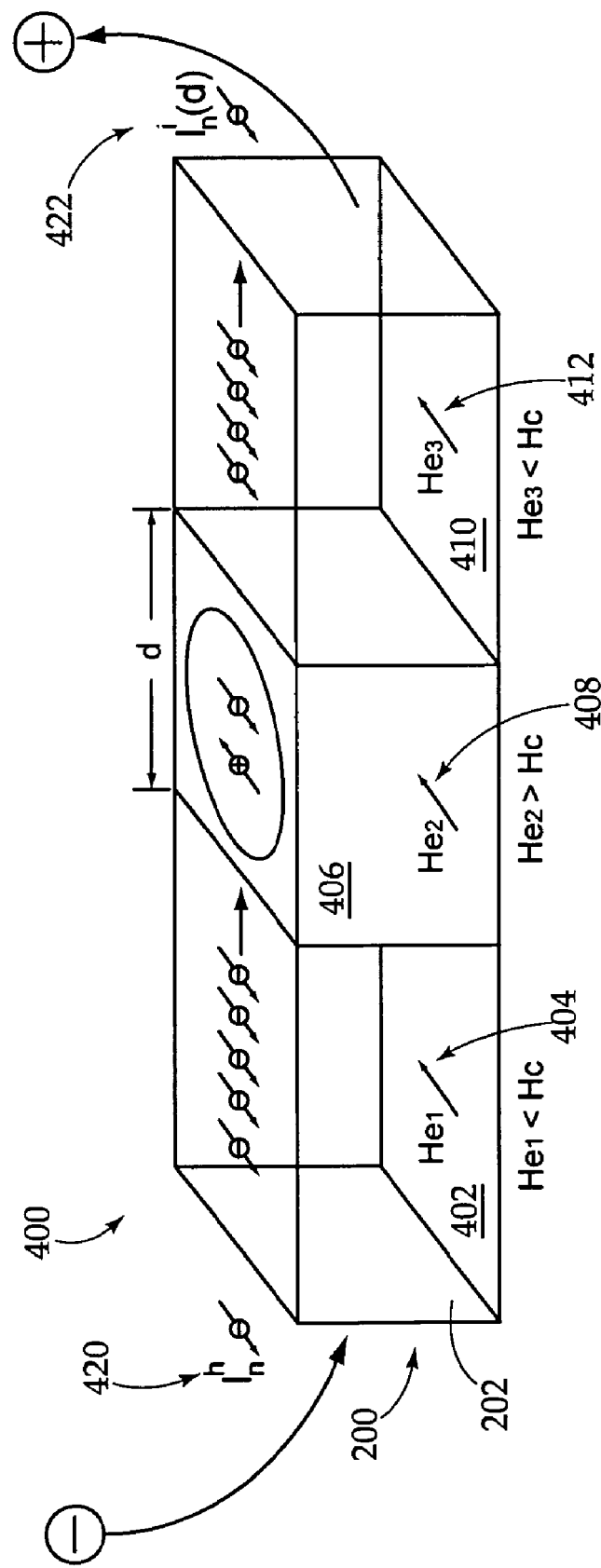

FIG. 4A through 4C depict magnetic tunnel junctions 400 based on inhomogeneously magnetized graphene sheet 202 in the GMM 200. In the present example, the FM and/or AFM materials as well as the electrode terminals have been omitted for clarity, however, those skilled in the art will recognize that the FM and/or AFM are part of the GMM 200 as illustrated in FIGS. 2A through 2D and that an electrode terminal can be disposed at each end of and in electrical contact with the graphene sheet 202. The graphene sheet 202 in the GMM can contact differently magnetized magnetic material(s) resulting in different exchange magnetic fields in the graphene sheet 202. For example a first region 402 can have a first exchange magnetic field ($H_{e1}$) 404, a second region 406 can have a second exchange magnetic field ($H_{e2}$) 408, and a third region 410 can have a third exchange magnetic field ($H_{e3}$) 412. The different exchange magnetic fields can form domain walls between the regions 402, 406, and 410.

In the present example, exchange magnetic field ($H_{e2}$) 408 in the second region 406 is stronger than critical field of the excitonic transition ($H_c$), resulting in an excitonic insulator (EI) phase (FIG. 1C), while exchange magnetic fields ($H_{e1}$ and $H_{e3}$) 404 and 412 can be weaker than the critical field of the excitonic transition ($H_c$). Tunneling current depends on the thickness d of the EI segment (i.e. the second region 406) and on the relative orientation of the exchange magnetic fields 404, 408, and 412.

FIG. 4A depicts pair-assisted spin-flip tunneling through the excitonic insulator region (i.e. the second region 406). Tunneling electrons change spin polarization by virtue of breaking excitonic pairs. As shown in FIGS. 4B and 4C, non-spin-flip tunneling between graphene domains (i.e. regions 402, 406, and 410) in parallel fields is similar to tunneling through an ordinary insulator and is weaker than that depicted in FIG. 4A. Inhomogeneity in the magnetic field of the graphene may be induced by coupling a ferrimagnetic layer to it or by heating a small area of the ferromagnetic material with a light source and remagnetizing it with a different strength field. In addition, or alternatively, each region may use a different magnetic material having different magnetizations.

Opening of an excitonic gap in the EI phase in a strong magnetic field creates additional possibilities for manipulating the band structure of magnetized graphene. The excitonic phase is a small-gap semiconductor with spin-polarized bands and is sensitive to the combination of gate voltage and spin polarization of electric current. This can be utilized in an alternative scheme for the GMM transistor, where two leads are separated by the EI junction whose conductivity depends on spin polarization of the current and is controlled by the gate voltage applied to it.

These devices (e.g. device 400) can utilize the excitonic instability in graphene induced by a strong magnetic field effect described above. Such a field effect can be achieved where magnetization of the magnetic layer in GMM is sufficiently large, and transforms a part of the graphene layer into an excitonic insulator (EI). The magnitude of the tunneling current depends on the size of the EI region (i.e. the thickness d of region 406) and also on the relative orientation of magnetizations on both sides of the EI region (i.e. the first region 402 and the third region 410) and within the EI region (second region 406). A chiral excitonic condensate (CEC) is present in the EI region causing the polarization of charge carriers change orientation inside the EI region. The CEC is a bound state of electrons and holes of opposite ("left" and "right") chiralities, $e_L h_R + e_R h_L$. This phenomenon of chirality flip can be visualized in the following way: imagine, for example, a right-handed electron recombining with a right-handed hole from the condensate and thus liberating from it a left-handed electron.

Thus, in the embodiments depicted in FIGS. 4A through 4C the spin polarized electric input current 420 supplied by the negative terminal can be reduced in magnitude, and in some embodiments flipped in spin polarization, based on the thickness d of the second region and the relative orientation of the magnetizations of the regions 402, 406, and 410. For example, in FIG. 4A, the spin polarized electrical input current 420 is reduced and flipped to generate a smaller flipped spin polarized electrical output current 422, while in FIGS. 4B and 4C the spin polarization is maintained at the output, but the magnitude of the current is reduced.

Figure 5A:
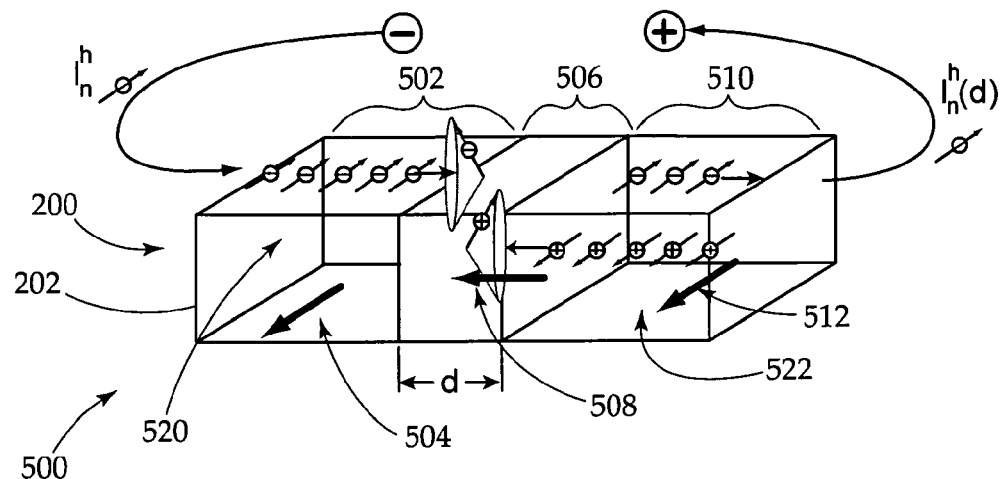
FIGS. 5A and 5B depict an exemplary spin-dependent quantum tunneling/interference device.
Figure 5B:
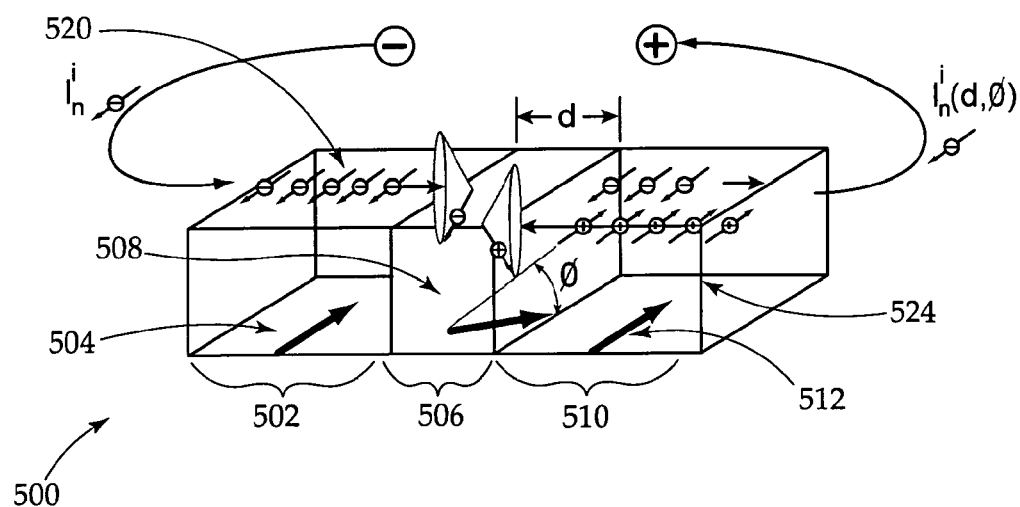

FIGS. 5A and 5B depict a spin-dependent quantum tunneling/interference device 500. In the present example, the FM and/or AFM materials as well as the electrode terminals have been omitted for clarity, however, those skilled in the art will recognize that the FM and/or AFM are part of the GMM 200 as illustrated in FIGS. 2A through 2D and that an electrode terminal can be disposed at each end of the GMM 200. The graphene sheet 202 in the GMM can have differently magnetized magnetic material(s) resulting in different exchange magnetic fields in the graphene sheet 202. For example, a first region 502 can have a first exchange magnetic field ($H_{e1}$) 504, a second region 506 can have a second exchange magnetic field ($H_{e2}$) 508, and a third region 510 can have a third exchange magnetic field ($H_{e3}$) 512. The different exchange magnetic fields can form domain walls between the regions 502, 506, and 510.

In the present examples (FIGS. 5A and 5B), the second region 506 is magnetized perpendicular (FIG. 5A) or at an angle φ to the rest of the graphene sheet (FIG. 5B). Both AP electrons 520 and P holes 522 injected into the second region 506 from the left and the right, respectively, experience spin precession around the field direction as they move. Quantum interference effects depending on the thickness d of the second region and the angle φ can lead to the recombination of electrons and holes in the second region 506, thus extinguishing electronic current.

In these devices (e.g. device 500), a region of the graphene sheet 202 is subjected to a magnetic field oriented at an angle to the rest of the graphene sheet 202. The quantum transmission probability of the polarized current depends both on the size of the second region 508 and on the relative angle between the magnetizations.

While the foregoing description has been made with reference to individual embodiments of the invention, it should be understood that those skilled in the art, making use of the teaching herein, may propose various changes and modifications without departing from the invention in its broader aspects. For example, specific embodiments have been described with single layers of graphene and magnetic materials, when in fact several layers of magnetic materials may be utilized. Similarly the graphene-(antiferro)-ferromagnet multilayers described herein may be repeated as desired rather than be limited to a single instance. The foregoing description being illustrative, the invention is limited only by the claims appended hereto.

The invention claimed is:

1. A spintronic device comprising:
   a graphene sheet having first and second surfaces, an electrical property of said graphene sheet being based on a magnetic field effect induced in said graphene sheet; and
   at least two electrode terminals electrically coupled to said graphene sheet, said at least two electrode terminals being spaced apart;
   wherein said graphene sheet is configured to conduct an electric signal between said at least two electrode terminals, said graphene sheet configured to affect said electrical signal based on said magnetic field effect induced in said graphene sheet.

2. The spintronic device of claim 1, further comprising:
   a first magnetic material in contact with at least a portion of said first or second surface, said magnetic material inducing said magnetic field effect in said graphene sheet.

3. The spintronic device of claim 2, wherein said first magnetic material has a non-zero magnetization.

4. The spintronic device of claim 2, wherein said first magnetic material is disposed on said graphene sheet as a plurality of non-continuous discrete sections.

5. The spintronic device of claim 2, wherein said first magnetic material comprises a ferromagnetic material.

6. The spintronic device of claim 2, wherein said first magnetic material comprises an antiferromagnetic material.

7. The spintronic device of claim 2, further comprising a second magnetic material in contact with said first magnetic material.

8. The spintronic device of claim 7, wherein said second magnetic material does not contact said graphene sheet.

9. The spintronic device of claim 8, wherein the first magnetic material comprises an antiferromagnetic material and the second magnetic material comprises a ferromagnetic material.

10. The spintronic device of claim 7, wherein a magnetic moment of said first magnetic material and a magnetic moment of said second magnetic material are correlated.

11. The spintronic device of claim 10, wherein the alignment of said magnetic moment of said first magnetic material and the alignment of said magnetic moment of said second magnetic material are correlated.

12. The spintronic device of claim 1, wherein said graphene sheet has a thickness less than about 10 nanometers.

13. The spintronic device of claim 1, wherein said graphene sheet has a thickness of a single monolayer of carbon.

14. The spintronic device of claim 1, wherein said graphene sheet possesses a non-zero magnetization.

15. An apparatus comprising:
    a spintronic device having at least two electrode terminals and a graphene sheet, said spintronic device configured to conduct an electric signal between at least two electrode terminals and through the graphene sheet in a plane of the sheet, said spintronic device affecting said electrical signal based on a magnetic field effect induced in said graphene sheet, the electrical properties of said graphene sheet being related to said magnetic field effect induced in said graphene sheet.

16. The apparatus of claim 15, wherein said spintronic device further comprises a first magnetic material in contact with at least a portion of said graphene sheet, said first magnetic material having a non-zero magnetization and operable to induce said magnetic field effect in said graphene sheet.

17. The apparatus of claim 16, wherein said first magnetic material is disposed on a surface of said graphene sheet as a plurality of non-continuous discrete sections.

18. The apparatus of claim 16, wherein said first magnetic material comprises at least one of a ferromagnetic material and an antiferromagnetic material.

19. The apparatus of claim 16, further comprising a second magnetic material in contact with said first magnetic material and not contacting said graphene sheet, said first magnetic material comprising an antiferromagnetic material and the second magnetic material comprising a ferromagnetic material.

20. A method of using a spintronic device having a graphene magnet multilayer (GMM) device comprising:
   supplying an electrical input signal to a first electrode terminal that is in electrical contact with a graphene sheet, said graphene sheet affecting said electrical input signal based on a magnetic field effect induced in said graphene sheet; and
   obtaining an electrical output signal at one or more of said at least two electrode terminals in response to said electrical input signal, said electrical output signal being based on said electrical input signal and said magnetic field effect induced in said graphene.

21. The method of claim 20, further comprising varying a magnitude of the magnetic field effect to vary an electrical property of said graphene sheet.

22. The method of claim 20, wherein said electrical input signal is an electric current and the method further comprises polarizing said electric current based on said magnetic field effect induced in said graphene sheet.

23. The method of claim 20, further comprising inducing a magnetization in a magnetic material of the GMM, said magnetic field effect induced in said graphene sheet being related to said magnetization in said magnetic material.

24. The method of claim 20, further comprising inducing different magnetic field effects in different regions of said graphene.

25. A method of forming a spintronic device comprising: disposing a graphene sheet on a substrate; contacting said graphene sheet with a first magnetic material; disposing at least two electrode terminals on said graphene sheet to provide regions for electrically coupling to said graphene; and inducing a magnetization in said first magnetic material.

26. The method of claim 25, wherein said magnetic material is an antiferromagnetic material and the method further comprises forming a second magnetic material comprising a ferromagnetic material on said first magnetic material.

27. The method of claim 25, wherein inducing a magnetization in said first magnetic material further comprises:
   inducing a first magnetization in a first region; and
   inducing a second magnetization in a second region.

* * * * *